United States Patent
Chou et al.

(10) Patent No.: US 7,821,789 B1
(45) Date of Patent: Oct. 26, 2010

(54) HEAT DISSIPATING APPARATUS FOR CHIPS

(75) Inventors: Chia-Shin Chou, Taipei Hsien (TW); Xiao-Zhu Chen, Shenzhen (CN); Zhen-Xing Ye, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/540,349

(22) Filed: Aug. 12, 2009

(30) Foreign Application Priority Data

Jul. 22, 2009 (CN) .......................... 2009 1 0304640

(51) Int. Cl.
*H05K 7/20* (2006.01)

(52) U.S. Cl. .................. 361/695; 361/704; 361/719; 165/80.3; 174/16.3

(58) Field of Classification Search .......... None
See application file for complete search history.

(56) References Cited

U.S. PATENT DOCUMENTS

| | | | | |
|---|---|---|---|---|
| 5,597,034 | A * | 1/1997 | Barker et al. | 165/80.3 |
| 6,343,014 | B1 * | 1/2002 | Lin | 361/697 |
| 6,948,555 | B1 * | 9/2005 | Garcia | 165/80.3 |
| 7,044,202 | B2 * | 5/2006 | Lopatinsky et al. | 165/122 |
| 7,120,019 | B2 * | 10/2006 | Foster et al. | 361/695 |
| 7,382,616 | B2 * | 6/2008 | Stefanoski | 361/698 |
| 7,475,718 | B2 * | 1/2009 | Reyzin et al. | 165/104.33 |
| 2002/0170703 | A1 * | 11/2002 | Huang et al. | 165/80.3 |
| 2003/0007867 | A1 * | 1/2003 | Chang | 415/220 |

* cited by examiner

*Primary Examiner*—Boris L Chervinsky
(74) *Attorney, Agent, or Firm*—Zhigang Ma

(57) ABSTRACT

A heat dissipating apparatus includes a heat sink, a blower, and a fan. The blower and the fan can be mounted together via a connection element. The heat sink defines an accommodating space. The blower and the fan can be positioned to the heat sink via the connection element, with the blower being accommodated in the accommodating space. The heat dissipating apparatus can achieve an optimal heat dissipating effect.

15 Claims, 3 Drawing Sheets

HEAT DISSIPATING APPARATUS FOR CHIPS

BACKGROUND

1. Technical Field

The present disclosure relates to heat dissipating apparatuses and, particularly, to a heat dissipating apparatus to dissipate heat generated by a chip.

2. Description of Related Art

Nowadays, working frequencies of some chips, such as central processing units (CPUs), are being produced to operate at faster and faster speeds. The faster the chips' speeds are the more heat they produce. Though a fan and a heat sink are ordinarily attached on a chip to dissipate heat generated by the chip, this kind of set-up is not enough anymore for the faster and advanced chips.

DETAILED DESCRIPTION

Figure 1:
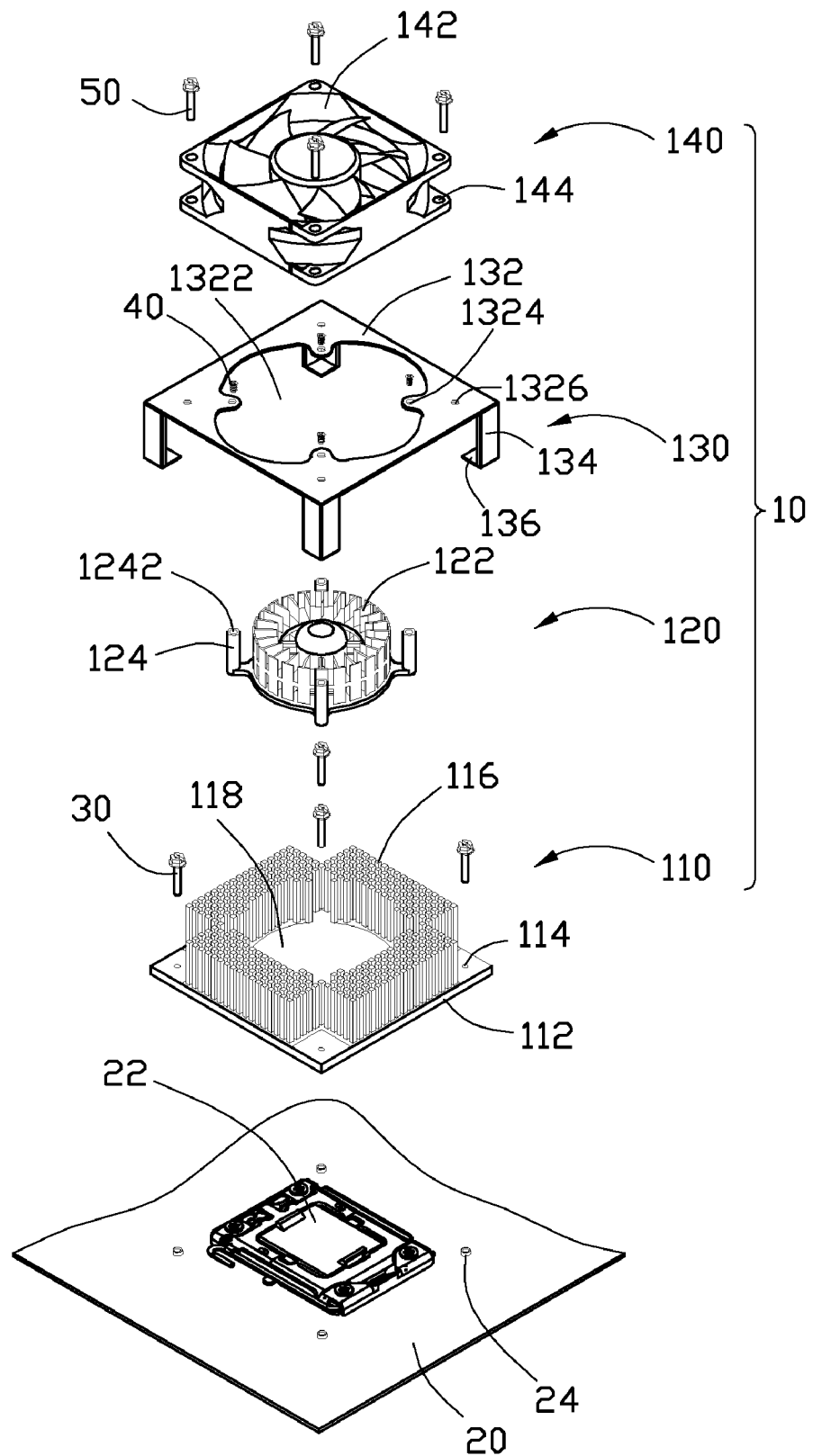
FIG. 1 is an exploded, isometric view of an exemplary embodiment of a heat dissipating apparatus.

Referring to FIG. 1, an exemplary embodiment of a heat dissipating apparatus 10 is used to dissipate heat generated by a chip, such as a central processing unit (CPU) chip 22 mounted on a computer motherboard 20. The heat dissipating apparatus 10 includes a heat sink 110, a blower 120, a connection element 130, and a fan 140.

The heat sink 110 includes a square-shaped heat-conducting plate 112. Four mounting holes 114 are respectively defined in four corners of the plate 112. A plurality of heat dissipating poles 116 perpendicularly extend from the plate 112. The plurality of heat dissipating poles 116 bound a substantially circular-shaped accommodating space 118.

The blower 120 includes a circular main body 122. Four positioning poles 124 perpendicularly and symmetrically extend from a circumference of a bottom of the main body 122. Each positioning pole 124 defines a screw hole 1242 in an upper end thereof.

The connection element 130 includes a square-shaped plate 132. A petal-shaped opening 1322 is defined in a center of the plate 132, the opening 1322 includes four petal portions. Four first through holes 1324 are symmetrically respectively defined in the plate 132 at four conjunctions formed by every two adjacent petal portions of the opening 1322. Four second through holes 1326 are defined in the plate 132 adjacent to the four corners of the plate 132. Four spaced tabs 134 perpendicularly extend down from the four corners of the plate 132. Each tab 134 includes a bent portion 136 perpendicularly extending from a bottom thereof.

The fan 140 includes a main body 142. Four positioning holes 144 are defined in four corners of the main body 142. It may be understood that the blower 120 and the fan 140 also include power lines. These power lines are well-known technology, and so are not described here.

Figure 2:
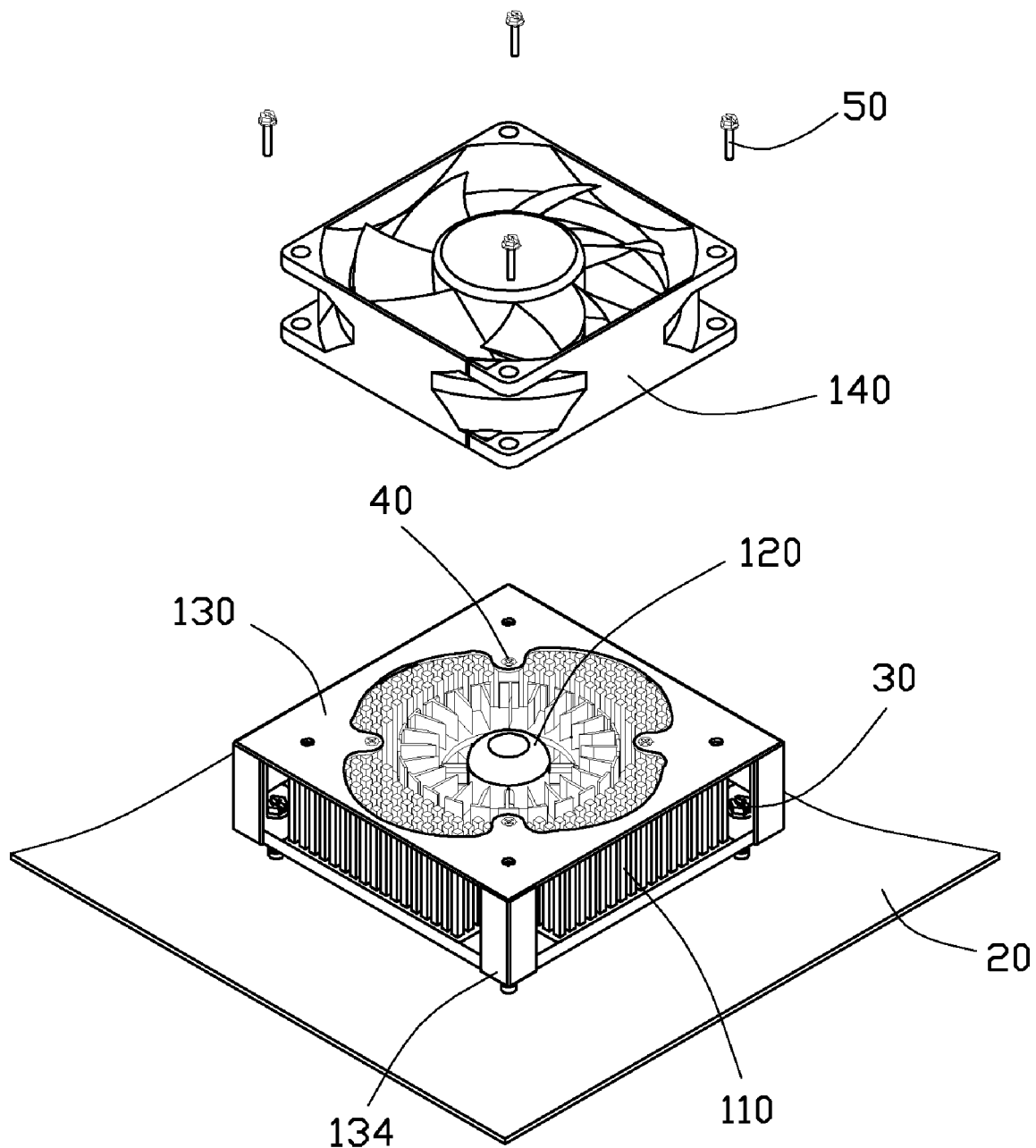
FIG. 2 is a partially assembled view of the heat dissipating apparatus of FIG. 1.
Figure 3:
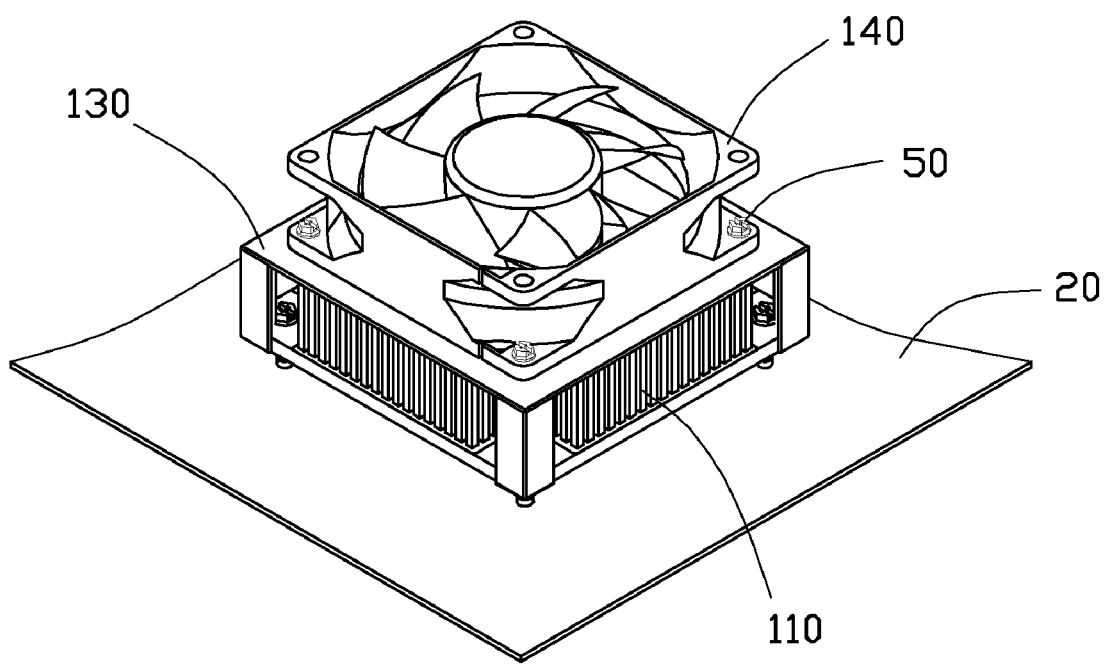
FIG. 3 is an assembled view of the heat dissipating apparatus of FIG. 1.

Referring to FIGS. 2 and 3, in assembly, four screws 30 are inserted into the four mounting holes 114 of the heat sink 110 and screwed into four corresponding screw holes 24 defined in the motherboard 20 around the CPU 22. Therefore, the heat sink 110 is positioned on the motherboard 20, and the plate 112 contacts the CPU 22 to conduct heat of the CPU 22 to the plurality of heat dissipating poles 116. Four screws 40 are extended through the four first through holes 1324 of the connection element 130 and screwed into the four corresponding screw holes 1242 of the blower 120. Therefore, the connection element 130 is positioned on the blower 120. The blower 120 is put into the accommodating space 118, and the four spaced tabs 134 of the connection element 130 are pulled out to make the bent portions 136 of the tabs 134 be attached to a bottom of the plate 112. Therefore, the connection element 130 together with the blower 120 is positioned on the plate 112. The blower 120 and parts of the plurality of heat dissipating poles 116 are exposed through the opening 1322. Four screws 50 are extended through the four positioning holes 144 of the fan 140 and screwed in the four corresponding second through holes 1326 of the connection element 130. Therefore, the fan 140 is positioned on the connection element 130.

In use, the blower 120 generates wind to dissipate heat around the plurality of heat dissipating poles 116 to outside. The fan 140 assists the blower 120 to dissipate heat around the plurality of heat dissipating poles 116 to outside, which can achieve an optimal heat dissipating effect.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A heat dissipating apparatus, comprising:
   a heat sink defining an accommodating space in a center of the heat sink;
   a blower;
   a fan; and
   a connection element, wherein the blower and the fan are respectively positioned on opposite sides of the connection element, the blower is positioned in the accommodating space via the connection element.

2. The heat dissipating apparatus of claim 1, wherein the heat sink comprises a heat-conducting plate, and a plurality of heat dissipating poles perpendicularly extending up from the plate, wherein the plurality of heat dissipating poles bound the accommodating space.

3. The heat dissipating apparatus of claim 2, wherein the heat-conducting plate is square-shaped.

4. The heat dissipating apparatus of claim 2, wherein the accommodating space is substantially circular-shaped.

5. The heat dissipating apparatus of claim 1, wherein the blower comprises a main body, and four positioning poles perpendicularly and symmetrically extending up from a bottom side of the main body, wherein the connection element is mounted on the blower via the positioning poles.

6. The heat dissipating apparatus of claim 1, wherein the connection element comprises a square-shaped plate, a petal-shaped opening is defined in a center of the plate, four first through holes are defined in the plate adjacent to the opening to position the blower, four second through holes are defined in the plate adjacent to four corners of the plate to position the fan.

7. The heat dissipating apparatus of claim 6, wherein four spaced tabs extend down from four corners of the plate, each of the spaced tabs comprises a bent portion perpendicularly extending from a bottom of the tab.

8. An electronic device, comprising:
a motherboard;
a chip installed on the motherboard;
a heat sink mounted on the motherboard and contact a top of the chip with a bottom of the heat sink, wherein the heat sink defines an accommodating space in a center of a top of the heat sink;
a blower;
a fan; and
a connection element, wherein the blower and the fan are respectively positioned on opposite sides of the connection element, the blower is positioned in the accommodating space via the connection element.

9. The electronic device of claim 8, wherein the heat sink comprises a heat-conducting plate contacting the top of the chip, and a plurality of heat dissipating poles perpendicularly extending up from the plate, wherein the plurality of heat dissipating poles bound the accommodating space.

10. The electronic device of claim 9, wherein the heat-conducting plate is substantially square-shaped.

11. The electronic device of claim 9, wherein the accommodating space is about circular-shaped.

12. The electronic device of claim 8, wherein the blower comprises a main body, and four positioning poles perpendicularly extending up from a bottom side of the main body.

13. The electronic device of claim 8, wherein the connection element comprises a substantially square-shaped plate, a substantially petal-shaped opening is defined in a center of the plate, four first through holes are defined in the plate adjacent to the opening to position the blower, four second through holes are defined in the plate adjacent to four corners of the plate to position the fan.

14. The electronic device of claim 13, wherein four spaced tabs respectively extend down from four corners of the plate, each of the spaced tabs comprises a bent portion perpendicularly extending from a bottom of the tab to engage with the bottom of the heat sink.

15. The electronic device of claim 8, wherein the chip is a central processing unit.

* * * * *